US008368460B2

(12) United States Patent
Kang

(10) Patent No.: US 8,368,460 B2
(45) Date of Patent: Feb. 5, 2013

(54) INTERNAL VOLTAGE GENERATION CIRCUIT AND INTEGRATED CIRCUIT INCLUDING THE SAME

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 104 days.

(21) Appl. No.: 12/981,205

(22) Filed: Dec. 29, 2010

(65) Prior Publication Data

US 2012/0105141 A1 May 3, 2012

(30) Foreign Application Priority Data

Oct. 29, 2010 (KR) ........................ 10-2010-0107171

(51) Int. Cl.
*G05F 1/10* (2006.01)

(52) U.S. Cl. ........................................................ 327/541

(58) Field of Classification Search .................. 327/535, 327/537, 538, 540, 541, 543
See application file for complete search history.

(56) References Cited

U.S. PATENT DOCUMENTS 6,809,576 B1 * 10/2004 Yamasaki ..................... 327/540
7,602,664 B2 * 10/2009 Kang ........................... 365/226
7,646,652 B2 * 1/2010 Byeon ...................... 365/189.09
7,724,076 B2 * 5/2010 Byeon ........................... 327/541
7,728,688 B2 * 6/2010 Shor ............................ 331/185
7,928,798 B2 * 4/2011 Lee ............................... 327/541
8,014,214 B2 * 9/2011 Kang ...................... 365/189.07

FOREIGN PATENT DOCUMENTS

KR 100390994 7/2003
KR 1020050013776 2/2005
KR 100780633 11/2007
KR 1020080092085 10/2008
KR 1020100064102 6/2010

OTHER PUBLICATIONS

Office Action issued by the Korean Intellectual Property Office on Dec. 22, 2011.
Notice of Allowance issued by the Korean Intellectual Property Office on Aug. 29, 2012.

* cited by examiner

*Primary Examiner* — Jeffrey Zweizig
(74) *Attorney, Agent, or Firm* — IP & T Group LLP

(57) ABSTRACT

An internal voltage generation circuit includes an internal reference voltage generation unit configured to generate first and second reference voltages, a core voltage generation unit configured to receive the first reference voltage and to generate a core voltage based on the first reference voltage, and a bit line pre-charge voltage generation unit configured to receive the second reference voltage and to generate a bit-line pre-charge voltage based on the second reference voltage.

17 Claims, 6 Drawing Sheets

200

ODP
OVER-DRIVING UNIT (240)
INTERNAL REFERENCE VOLTAGE GENERATION CIRCUIT (210)
VREFC
CORE VOLTAGE GENERATION UNIT (220)
VCORE
FIRST INTERNAL CIRCUIT (230)
VREFBLP
BIT LINE PRE-CHARGE VOLTAGE GENERATION UNIT (250)
VBLP
SECOND INTERNAL CIRCUIT (260)

INTERNAL VOLTAGE GENERATION CIRCUIT AND INTEGRATED CIRCUIT INCLUDING THE SAME

CROSS-REFERENCE TO RELATED APPLICATIONS

The present application claims priority of Korean Patent Application No. 10-2010-0107171, filed on Oct. 29, 2010, which is incorporated herein by reference in its entirety.

BACKGROUND OF THE INVENTION

Exemplary embodiments of the present invention relate to an internal voltage generation circuit and an integrated circuit including the same.

In general, semiconductor devices use an external power source voltage VDD_EX, which is supplied from the outside. Since the external power source voltage VDD_EX may have a change in level due to noise, the semiconductor devices are equipped with an internal voltage generation circuit for generating a stable internal voltage. Here, the internal voltage may include many different types of voltages, e.g., a core voltage VCORE which is used in a core region including a memory cell, a cell plate voltage VCP which is used as a plate voltage of a memory cell capacitor, and a bit line pre-charge voltage VBLP which is used for pre-charging a bit line. Here, the cell plate voltage VCP and the bit line pre-charge voltage VBLP are generated from the core voltage VCORE, and those are generated to have the level corresponding to a half of the core voltage VCORE in order to minimize power consumption. The cell plate voltage VCP and the bit line pre-charge voltage VBLP are generated through the same internal voltage generation unit. Hereafter, an example of the bit line pre-charge voltage VBLP is described.

FIG. 1 is a block diagram illustrating a conventional integrated circuit.

Referring to FIG. 1, the integrated circuit 100 includes a source reference voltage generation unit 110, a core reference voltage generation unit 120, a core voltage generation unit 130, a first internal circuit 140, an over-driving unit 150, a bit line pre-charge voltage generation unit 160, and a second internal circuit 170.

The source reference voltage generation unit 110 generates a source reference voltage VREF. The core reference voltage generation unit 120 generates a core reference voltage VREFC based on the source reference voltage VREF. The core voltage generation unit 130 generates a core voltage VCORE based on the core reference voltage VREFC.

The first internal circuit 140 performs a predetermined operation by receiving the core voltage VCORE. The over-driving unit 150 over-drives a core voltage VCORE terminal in response to an over-drive control signal ODP. The bit line pre-charge voltage generation unit 160 generates a bit line pre-charge voltage VBLP based on the core voltage VCORE. The second internal circuit 170 receives the bit line pre-charge voltage VBLP and performs a predetermined operation.

More specifically, the source reference voltage generation unit 110 generates the source reference voltage VREF based on an external power source voltage VDD_EX (not shown) and an external ground voltage VSS_EX (not shown), and the generated source reference voltage VREF is maintained at a stable level although the conditions of process, voltage and temperature (PVT) may be changed a bit. For example, the source reference voltage generation unit 110 may include a bandgap circuit or a Widlar circuit.

The over-driving unit 150 may operate to secure a fast sensing operation of a bit line sense amplifier (BLSA).

Hereafter, the operation of the integrated circuit 100 having the above structure is described.

The source reference voltage generation unit 110 receives the external power source voltage VDD_EX (not shown) and the external ground voltage VSS_EX (not shown), and generate the source reference voltage VREF. In particular, the source reference voltage generation unit 110 generates a stable source reference voltage VREF although the conditions of process, voltage and temperature (PVT) may be changed a bit.

The core reference voltage generation unit 120 generates the core reference voltage VREFC for generating the core voltage VCORE based on the source reference voltage VREF generated in the source reference voltage generation unit 110, and applies the generated core reference voltage VREFC to the core voltage generation unit 130. Here, the core reference voltage generation unit 120 may generate the core reference voltage VREFC through a down-conversion method.

The core voltage generation unit 130 generates the core voltage VCORE of a predetermined voltage level based on the core reference voltage VREFC and supplies the generated core voltage VCORE to the first internal circuit 140.

Here, the bit line pre-charge voltage generation unit 160 generates the bit line pre-charge voltage VBLP based on the core voltage VCORE and supplies the generated bit line pre-charge voltage VBLP to the second internal circuit 170. The bit line pre-charge voltage generation unit 160 may also generate the bit line pre-charge voltage VBLP through the down-conversion method, just as the core voltage generation unit 130.

Meanwhile, the over-driving unit 150 over-drives the core voltage VCORE terminal in response to the over-drive control signal ODP.

The conventional integrated circuit 100 of the above structure, however, may malfunction as follows.

FIG. 2 is a timing diagram describing the operation of the integrated circuit 100.

Referring to FIG. 2, the core voltage VCORE maintains a predetermined target level by the core voltage generation unit 130, and the bit line pre-charge voltage VBLP maintains a predetermined target level by the bit line pre-charge voltage generation unit 160. In this state, when the over-drive control signal ODP is enabled upon receipt of an active command ACT, the voltage level of the core voltage VCORE terminal is increased while the over-driving unit 150 performs an over-driving operation. The increased core voltage VCORE, however, is used as a reference voltage of the bit line pre-charge voltage generation unit 160. Therefore, the bit line pre-charge voltage VBLP generated in the bit line pre-charge voltage generation unit 160 is also increased during the time that the core voltage VCORE is increased. In this case, the second internal circuit 170 to which the increased bit line pre-charge voltage VBLP is supplied may malfunction.

SUMMARY OF THE INVENTION

An embodiment of the present invention is directed to an integrated circuit which may maintain a bit line pre-charge voltage VBLP and a cell plate voltage VCP at target levels although a core voltage VCORE terminal is over-driven.

In accordance with an exemplary embodiment of the present invention, an internal voltage generation circuit includes an internal reference voltage generation unit configured to generate first and second reference voltages; a core voltage generation unit configured to receive the first reference voltage and to generate a core voltage based on the first reference voltage; a bit line pre-charge voltage generation unit configured to receive the second reference voltage and to generate a bit-line pre-charge voltage based on the second reference voltage.

In accordance with another exemplary embodiment of the present invention, an integrated circuit includes a reference voltage generation circuit configured to generate a first reference voltage corresponding to a core voltage and a second reference voltage corresponding to a bit-line pre-charge voltage; a core voltage generation unit configured to generate the core voltage based on the first reference voltage; and a bit line pre-charge voltage generation unit configured to generate the bit-line pre-charge voltage based on the second reference voltage.

The reference voltage generation circuit may include a source reference voltage generation unit configured to generate a source reference voltage by using an external power source voltage and an external ground voltage; a first reference voltage generation unit configured to generate the first reference voltage based on the source reference voltage; and a second reference voltage generation unit configured to generate the second reference voltage based on the source reference voltage. The integrated circuit may further include: an over-driving unit configured to supply an external power source voltage to a terminal providing the core voltage in response to an over-drive control signal.

In accordance with another exemplary embodiment of the present invention, an integrated circuit includes a reference voltage generation circuit configured to generate a first reference voltage corresponding to a core voltage and a second reference voltage corresponding to a cell plate voltage; a core voltage generation unit configured to generate the core voltage based on the first reference voltage; and a cell plate voltage generation unit configured to generate the cell plate voltage based on the second reference voltage.

The reference voltage generation circuit may include a source reference voltage generation unit configured to generate a source reference voltage by using an external power source voltage and an external ground voltage; a first reference voltage generation unit configured to generate the first reference voltage based on the source reference voltage; and a second reference voltage generation unit configured to generate the second reference voltage based on the source reference voltage. The integrated circuit may further include: an over-driving unit configured to supply an external power source voltage to a terminal providing the core voltage in response to an over-drive control signal.

DESCRIPTION OF SPECIFIC EMBODIMENTS

Figure 1:
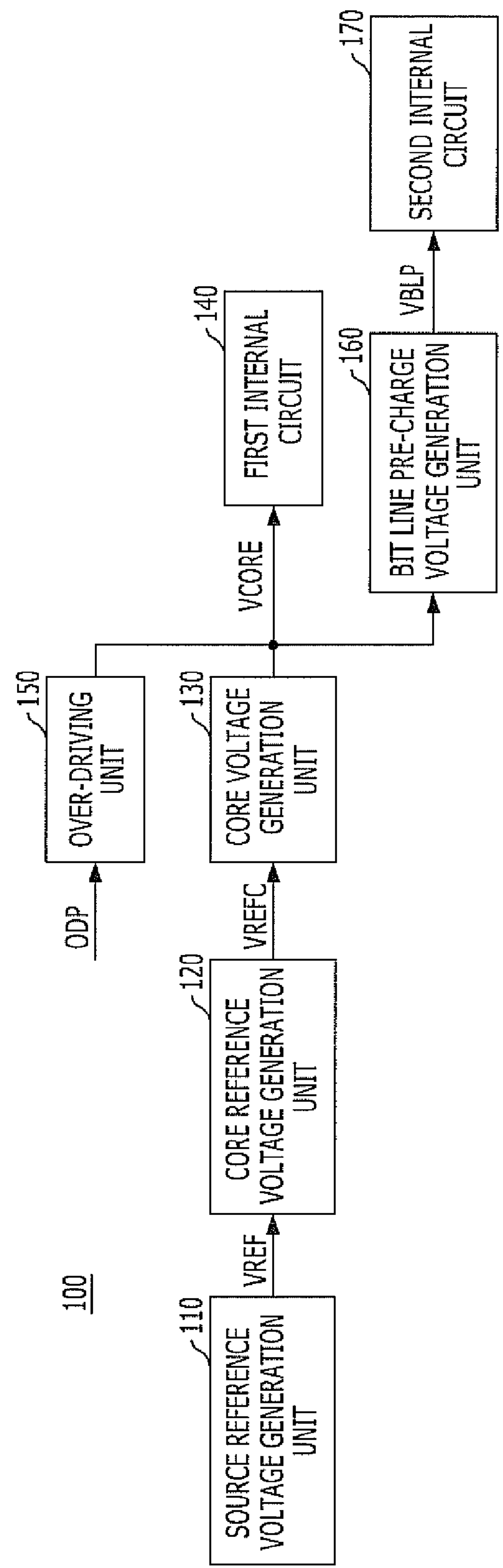
FIG. 1 is a block diagram illustrating a conventional integrated circuit.
Figure 2:
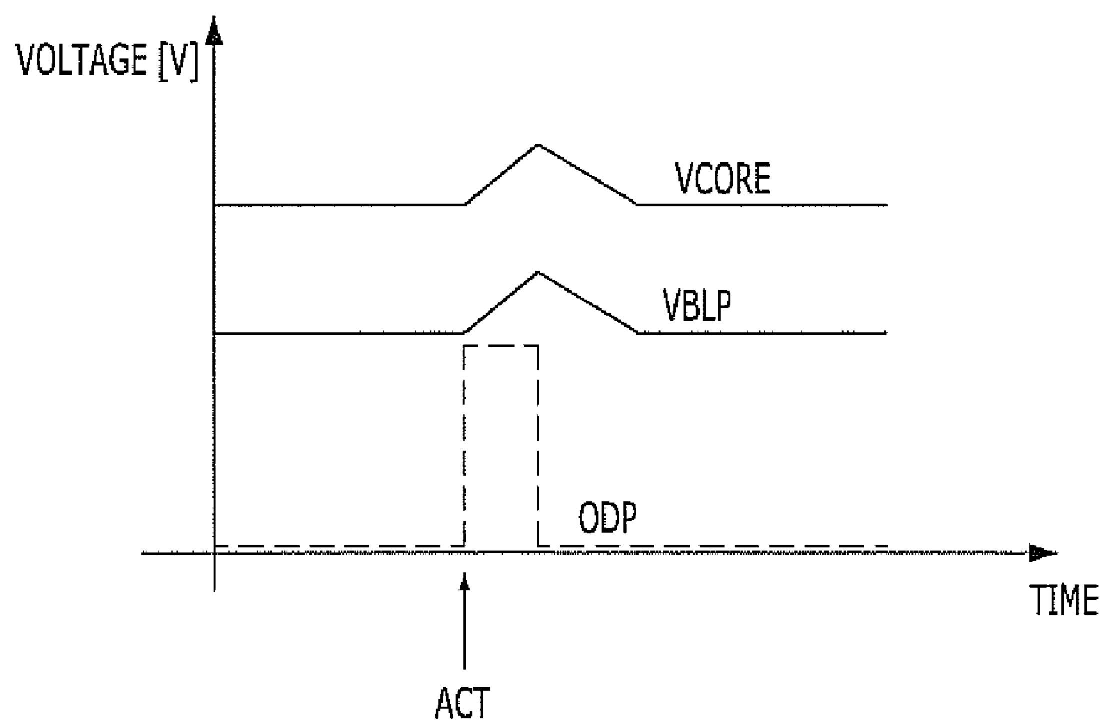
FIG. 2 is a timing diagram describing the operation of the integrated circuit illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
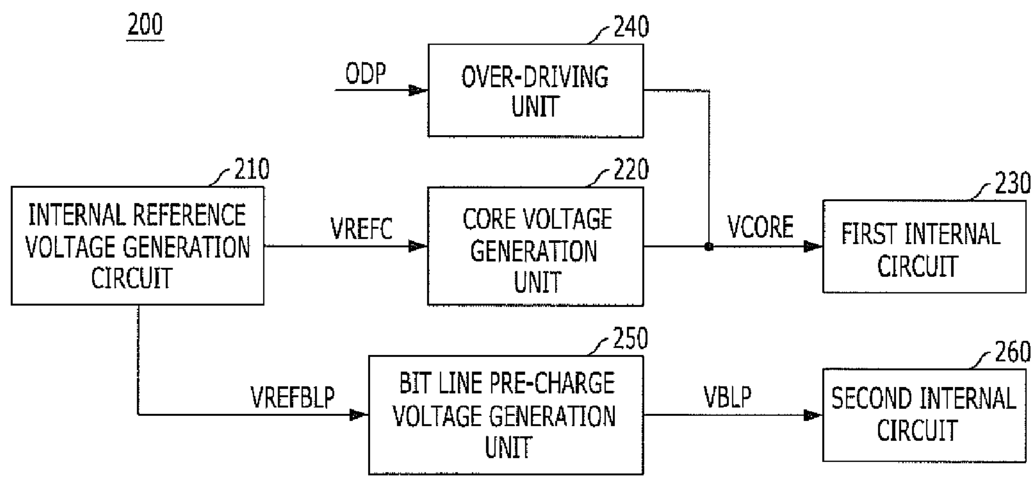
FIG. 3 is a block diagram illustrating an integrated circuit in accordance with an embodiment of the present invention.

FIG. 3 is a block diagram illustrating an integrated circuit in accordance with an embodiment of the present invention.

Referring to FIG. 3, the integrated circuit 200 includes an internal reference voltage generation circuit 210, a core voltage generation unit 220, a first internal circuit 230, an over-driving unit 240, a bit line pre-charge voltage generation unit 250, and a second internal circuit 260.

The internal reference voltage generation circuit 210 receives an external power source voltage VDD_EX (not shown) and an external ground voltage VSS_EX (not shown) and generates a core reference voltage VREFC and a bit line pre-charge reference voltage VREFBLP. The core voltage generation unit 220 generates a core voltage VCORE based on the core reference voltage VREFC. The first internal circuit 230 performs a predetermined operation by receiving the core voltage VCORE. The over-driving unit 240 over-drives a core voltage VCORE terminal in response to an over-drive control signal ODP. The bit line pre-charge voltage generation unit 250 generates a bit line pre-charge voltage VBLP based on the bit line pre-charge reference voltage VREFBLP. The second internal circuit 260 receives the bit line pre-charge voltage VBLP and performs a predetermined operation.

Figure 4:
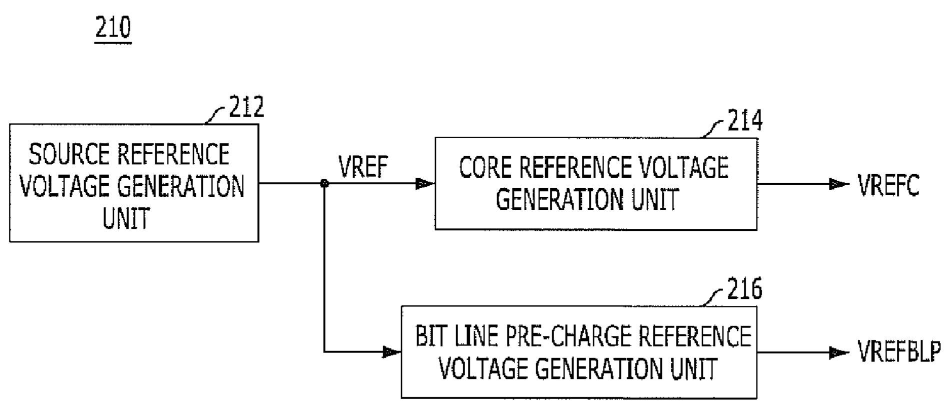
FIG. 4 is a block diagram illustrating an internal reference voltage generation unit shown in FIG. 3.

FIG. 4 is a block diagram illustrating the internal reference voltage generation unit 210 shown in FIG. 3.

Referring to FIG. 4, the internal reference voltage generation circuit 210 includes a source reference voltage generation unit 212, a core reference voltage generation unit 214, and a bit line pre-charge reference voltage generation unit 216.

The source reference voltage generation unit 212 receives the external power source voltage VDD_EX and the external ground voltage VSS_EX and generates a source reference voltage VREF. The core reference voltage generation unit 214 generates the core reference voltage VREFC based on the source reference voltage VREF. The bit line pre-charge reference voltage generation unit 216 generates the bit line pre-charge reference voltage VREFBLP based on the source reference voltage VREF. Here, the core voltage VCORE is a voltage used for a core region including a memory cell (not shown), and the bit line pre-charge voltage VBLP is a voltage used for pre-charging a bit line. Meanwhile, the bit line pre-charge voltage VBLP may be also used as a plate voltage of a memory cell capacitor, which is referred to as a cell plate voltage VCP.

Here, the source reference voltage generation unit 212 may include a bandgap circuit or a Widlar circuit to generate a stable source reference voltage VREF although the conditions of process, voltage and temperature (PVT) are changed.

Figure 5A:
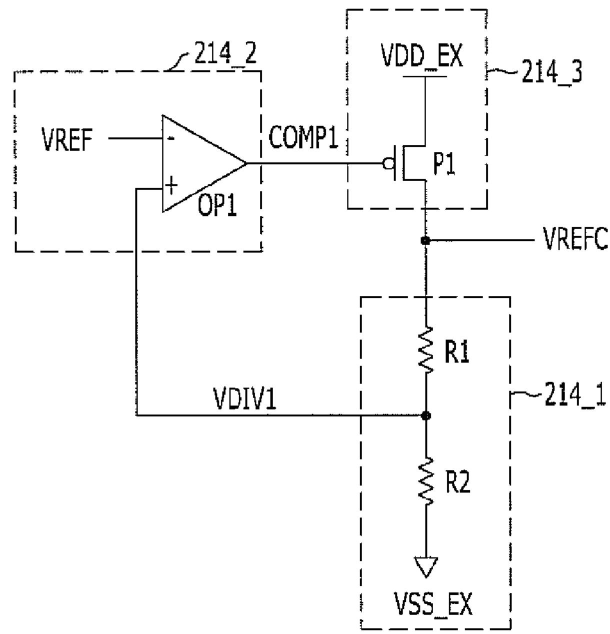
FIG. 5A is a block diagram illustrating a core reference voltage generation unit shown in FIG. 4.
Figure 5B:
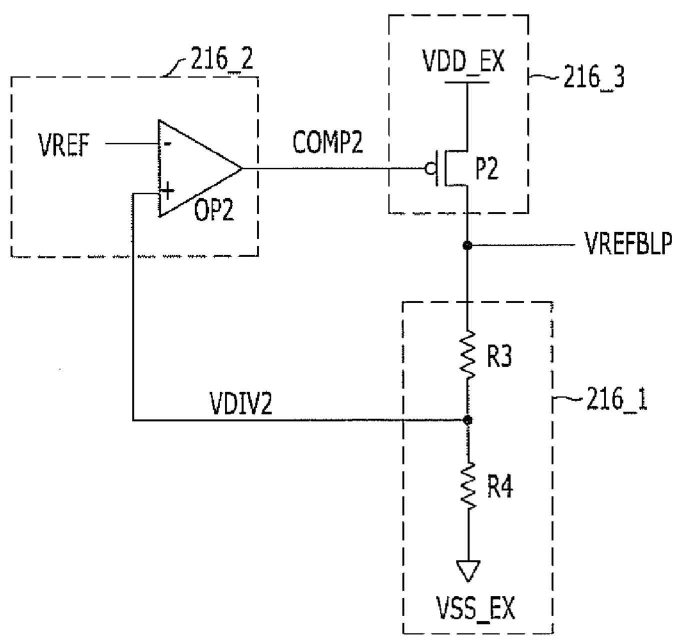
FIG. 5B is a block diagram illustrating a bit line pre-charge reference voltage generation unit shown in FIG. 4.

FIG. 5A is a block diagram illustrating the core reference voltage generation unit 214 shown in FIG. 4. FIG. 5B is a block diagram illustrating the bit line pre-charge reference voltage generation unit 216 shown in FIG. 4.

Referring to FIG. 5A, the core reference voltage generation unit 214 includes a first dividing block 214_1, a first comparison block 214_2, and a first driving block 214_3. The first dividing block 214_1 is disposed between a core reference voltage VREFC terminal and an external ground voltage VSS_EX terminal, and divides the voltage loaded between the core reference voltage VREFC terminal and the external ground voltage VSS_EX terminal at a predetermined first division rate. The first comparison block 214_2 compares a first divided voltage VDIV1 obtained from the division in the first dividing block 214_1 with the source reference voltage VREF. The first driving block 214_3 drives the core reference voltage VREFC terminal with the external power source/supply voltage VDD_EX in response to an output signal COMP1 of the first comparison block 214_2.

Here, the first dividing block 214_1 includes a first resistor R1 coupled between the core reference voltage VREFC terminal and a first divided voltage VDIV1 terminal and a second resistor R2 coupled between the first divided voltage VDIV1 terminal and the external ground voltage VSS_EX terminal. The first comparison block 214_2 includes a first differential amplifier OP1 which receives the source reference voltage VREF through a negative (−) input terminal, receives the first divided voltage VDIV1 through a positive (+) input terminal, and outputs a comparison signal COMP1. Also, the first driving block 214_3 includes a first PMOS transistor P1 which receives the comparison signal COMP1 of the first comparison block 214_2 as a gate input and includes a source and a drain coupled to an external power source voltage VDD_EX terminal and the core reference voltage VREFC terminal, respectively.

Referring to FIG. 5B, the bit line pre-charge reference voltage generation unit 216 includes a second dividing block 216_1, a second comparison block 216_2, and a second driving block 216_3. The second dividing block 216_1 is disposed between a bit line pre-charge reference voltage VREFBLP terminal and the external ground voltage VSS_EX terminal, and divides the voltage loaded between the bit line pre-charge reference voltage VREFBLP terminal and the external ground voltage VSS_EX terminal at a predetermined second division rate. The second comparison block 216_2 compares a second divided voltage VDIV2 obtained from the division in the second dividing block 216_1 with the source reference voltage VREF. The second driving block 216_3 drives the bit line pre-charge reference voltage VREFBLP terminal with the external power source voltage VDD_EX in response to an output signal COMP2 of the second comparison block 216_2.

Here, the second dividing block 216_1 includes a third resistor R3 coupled between the bit line pre-charge reference voltage VREFBLP terminal and a second divided voltage VDIV2 terminal and a fourth resistor R4 coupled between the second divided voltage VDIV2 terminal and the external ground voltage VSS_EX terminal. The second comparison block 216_2 includes a second differential amplifier OP2 which receives the source reference voltage VREF through a negative (−) input terminal, receives the second divided voltage VDIV2 through a positive (+) input terminal, and outputs a comparison signal COMP2. Also, the second driving block 216_3 includes a second PMOS transistor P2 which receives the comparison signal COMP2 of the second comparison block 216_2 as a gate input and includes a source and a drain coupled to the external power source voltage VDD_EX terminal and the bit line pre-charge reference voltage VREFBLP terminal, respectively.

Figure 6:
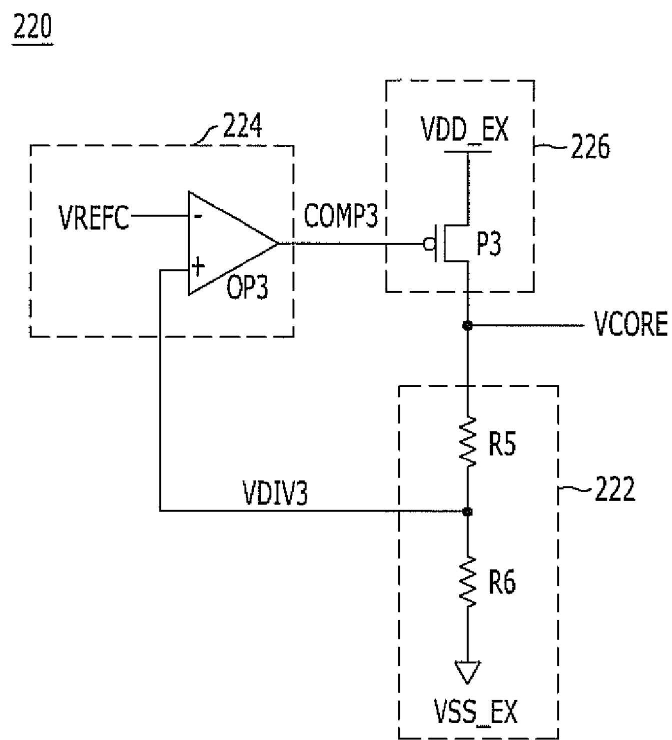
FIG. 6 is a block diagram illustrating a core voltage generation unit shown in FIG. 3.

FIG. 6 is a block diagram illustrating the core voltage generation unit 220 shown in FIG. 3.

Referring to FIG. 6, the core voltage generation unit 220 includes a third dividing block 222, a third comparison block 224, and a third driving block 226. The third dividing block 222 is disposed between the core voltage VCORE terminal and the external ground voltage VSS_EX terminal, and divides the voltage loaded between the core voltage VCORE terminal and the external ground voltage VSS_EX terminal at a predetermined third division rate. The third comparison block 224 compares a third divided voltage VDIV3 obtained from the division in the third dividing block 222 with the core reference voltage VREFC. The third driving block 226 drives the core voltage VCORE terminal with the external power source voltage VDD_EX in response to an output signal COMP3 of the third comparison block 224.

Here, the third dividing block 222 includes a fifth resistor R5 coupled between the core voltage VCORE terminal and a third divided voltage VDIV3 terminal of the third dividing block 222 and a sixth resistor R6 coupled between the third divided voltage VDIV3 terminal of the third dividing block 222 and the external ground voltage VSS_EX terminal. The third comparison block 224 includes a third differential amplifier OP3 which receives the core reference voltage VREFC through a negative (−) input terminal, receives the third divided voltage VDIV3 through a positive (+) input terminal, and outputs a comparison signal COMP3. Also, the third driving block 226 includes a third PMOS transistor P3 which receives the comparison signal COMP3 of the third comparison block 224 as a gate input and includes a source and a drain coupled to the external power source voltage VDD_EX terminal and the core voltage VCORE terminal, respectively.

Figure 7:
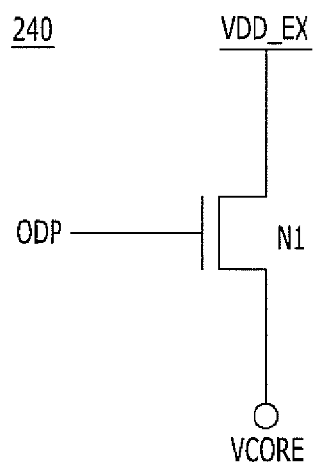
FIG. 7 is a block diagram illustrating an over-driving unit shown in FIG. 3.

FIG. 7 is a block diagram illustrating the over-driving unit 240 shown in FIG. 3.

Referring to FIG. 7, the over-driving unit 240 includes a first NMOS transistor N1 which receives an over-drive control signal ODP as a gate input and includes a drain and a source coupled to the external power source voltage VDD_EX terminal and the core voltage VCORE terminal, respectively. Here, the over-drive control signal ODP may be enabled to have a higher voltage level than the external power source voltage VDD_EX so as to over-drive the core voltage VCORE terminal in a duration where the over-driving unit 240 is activated. For example, the over-drive control signal ODP has a boost voltage VPP level in the duration where the over-driving unit 240 is activated.

Figure 8:
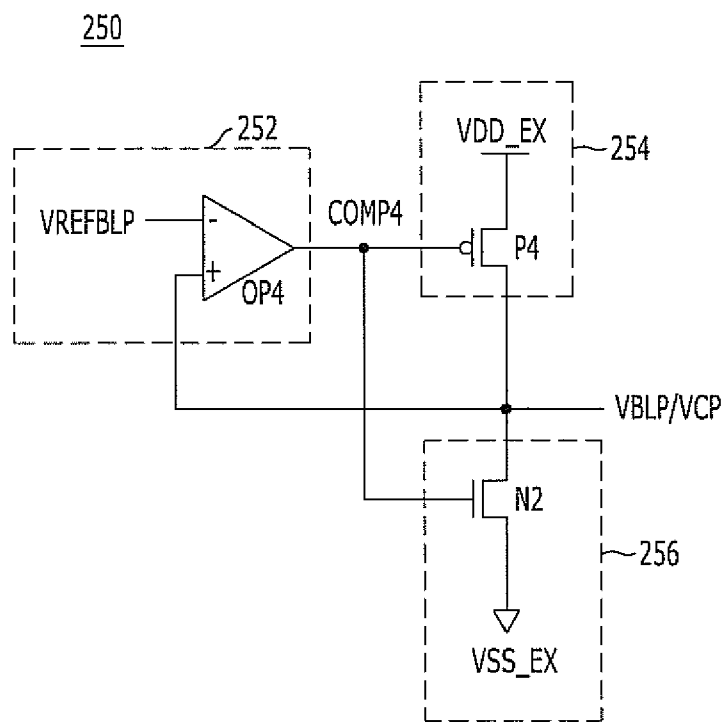
FIG. 8 is a block diagram illustrating a bit line pre-charge voltage generation unit shown in FIG. 3.

FIG. 8 is a block diagram illustrating the bit line pre-charge voltage generation unit 250 shown in FIG. 3.

Referring to FIG. 8, the bit line pre-charge voltage generation unit 250 includes a fourth comparison block 252, a pull-up driving block 254, and a pull-down driving block 256. The fourth comparison block 252 compares the bit line pre-charge reference voltage VREFBLP with the bit line pre-charge voltage VBLP. The pull-up driving block 254 pull-up drives a bit line pre-charge voltage VBLP terminal with the external power source voltage VDD_EX in response to an output signal COMP4 of the fourth comparison block 252. The pull-down driving block 256 pull-down drives the bit line pre-charge voltage VBLP terminal with the external ground voltage VSS_EX in response to the output signal COMP4 of the fourth comparison block 252.

Here, the fourth comparison block 252 includes a fourth differential amplifier OP4 which receives the bit line pre-charge reference voltage VREFBLP through a negative (−) input terminal, receives the bit line pre-charge voltage VBLP through the positive (+) input terminal, and outputs a comparison signal COMP4. The pull-up driving block 254 includes a fourth PMOS transistor which receives the comparison signal COMP4 of the fourth comparison block 252 as a gate input and includes a source and a drain coupled to the external power source voltage VDD_EX terminal and the bit line pre-charge voltage VBLP terminal, respectively. Also, the pull-down driving block 256 includes a second NMOS transistor which receives the comparison signal COMP4 of the fourth comparison block 252 as a gate input and includes a drain and a source coupled to the bit line pre-charge voltage VBLP terminal and the external ground voltage VSS_EX terminal, respectively.

Hereafter, the operation of the integrated circuit 200 having the above-described structure is described in accordance with an embodiment of the present invention.

First, the internal reference voltage generation circuit 210 receives an external power source voltage VDD_EX (not shown) and an external ground voltage VSS_EX (not shown) and generates a core reference voltage VREFC and a bit line pre-charge reference voltage VREFBLP. More specifically, the source reference voltage generation unit 212 generates a stable source reference voltage VREF although the conditions of process, voltage and temperature (PVT) may be changed, and the core reference voltage generation unit 214 generates a core reference voltage VREFC corresponding to a core voltage VCORE based on the source reference voltage VREF generated in the source reference voltage generation unit 212, and the bit line pre-charge reference voltage generation unit 216 generates a bit line pre-charge reference voltage VREFBLP corresponding to a bit line pre-charge voltage VBLP based on the source reference voltage VREF generated in the source reference voltage generation unit 212.

Subsequently, the core voltage generation unit 220 maintains the core voltage VCORE at a constant level based on the core reference voltage VREFC. The first internal circuit 230 receives the core voltage VCORE which is generated in the core voltage generation unit 220 and performs a predetermined internal operation. For example, based on the core voltage VCORE, the first internal circuit 230 senses and amplifies a data of a bit line after an active command ACT is applied.

Also, the bit line pre-charge voltage generation unit 250 maintains the bit line pre-charge voltage VBLP at a constant level based on the bit line pre-charge reference voltage VREFBLP. The second internal circuit 260 receives the bit line pre-charge voltage which is generated in the bit line pre-charge voltage generation unit 250 and performs a predetermined internal operation. For example, the second internal circuit 260 pre-charges the bit line based on the bit line pre-charge voltage VBLP after a data of the bit line is sensed and amplified.

When the first internal circuit 230 senses and amplifies a data of a bit line after the active command ACT is applied, an over-driving operation is performed together. The over-driving operation is performed to quickly complete the sense and amplification operation of a bit line sense amplifier (BLSA). This is described hereafter with reference to FIG. 9.

Figure 9:
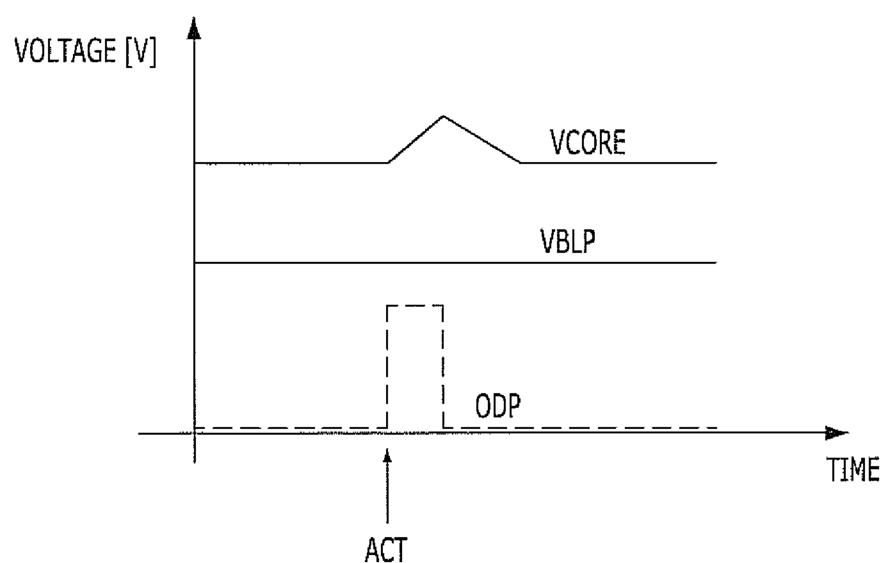
FIG. 9 is a timing diagram describing an operation of the integrated circuit shown in FIG. 3.

FIG. 9 is a timing diagram describing an operation of the integrated circuit shown in FIG. 3.

When an over-drive control signal ODP is enabled upon receipt of the active command ACT, the over-driving unit 240 over-drives the core voltage VCORE terminal in response to the enabled over-drive control signal ODP. Accordingly, the voltage level of the core voltage VCORE terminal is increased. However, since the bit line pre-charge voltage VBLP is not affected by the over-driving operation, it may maintain a predetermined target voltage level. This is because the core voltage generation unit 220 and the bit line pre-charge voltage generation unit 250 receive reference voltages separately and generate predetermined voltages, respectively.

According to the embodiment of the present invention, although the voltage level of the core voltage VCORE is increased according to the over-driving operation, it does not affect the bit line pre-charge voltage VBLP. Therefore, the second internal circuit 260 which receives the bit line pre-charge voltage VBLP may perform a stable internal operation, which is advantageous.

According to an embodiment of the present invention, although the voltage level of a core voltage VCORE terminal is increased by an active operation, which is an over-driving operation, the generations of the bit line pre-charge voltage VBLP and the cell plate voltage VCP are not affected because an independent reference voltage for the bit line pre-charge voltage VBLP and the cell plate voltage VCP is generated and supplied. Therefore, stable bit line pre-charge voltage VBLP and cell plate voltage VCP are generated, and an internal circuit which receives the stable bit line pre-charge voltage VBLP and cell plate voltage VCP may also perform a stable operation. Consequently, desired operation reliability of the integrated circuit is obtained.

While the present invention has been described with respect to the specific embodiments, it will be apparent to those skilled in the art that various changes and modifications may be made without departing from the spirit and scope of the invention as defined in the following claims.

For example, although a bit line pre-charge voltage is described as an example in the above-described embodiments, the exemplary embodiments of the present invention may be applied to any internal voltage, such as a cell plate voltage that is generated based on a core voltage.

What is claimed is:

1. An internal voltage generation circuit, comprising:

an internal reference voltage generation unit configured to generate first and second reference voltages;

a core voltage generation unit configured to receive the first reference voltage and to generate a core voltage based on the first reference voltage; and a bit line pre-charge voltage generation unit configured to receive the second reference voltage and to generate a bit-line pre-charge voltage based on the second reference voltage, wherein the internal reference voltage generation circuit comprises:

a source reference voltage generation unit configured to generate a source reference voltage by using a power source voltage and a ground voltage;

a first reference voltage generation unit configured to receive the source reference voltage and to generate the first reference voltage based on the source reference voltage; and a second reference voltage generation unit configured to receive the source reference voltage and to generate the second reference voltage based on the source reference voltage.

2. The internal voltage generation circuit of claim 1, further comprising:

an over-driving unit configured to supply a power source voltage to a terminal providing the core voltage in response to an over-drive control signal.

3. An integrated circuit, comprising:

a reference voltage generation circuit configured to generate a first reference voltage corresponding to a core voltage and a second reference voltage corresponding to a bit-line pre-charge voltage;

a core voltage generation unit configured to generate the core voltage based on the first reference voltage; and a bit line pre-charge voltage generation unit configured to generate the bit-line pre-charge voltage based on the second reference voltage, wherein the reference voltage generation circuit comprises:

a source reference voltage generation unit configured to generate a source reference voltage by using a power supply voltage and a ground voltage;

a first reference voltage generation unit configured to generate the first reference voltage based on the source reference voltage; and a second reference voltage generation unit configured to generate the second reference voltage based on the source reference voltage.

4. The integrated circuit of claim 3, wherein the source reference voltage generation unit comprises a bandgap circuit or a Widlar circuit.

5. The integrated circuit of claim 3, further comprising:

an over-driving unit configured to supply a power supply voltage to a terminal providing the core voltage in response to an over-drive control signal.

6. The integrated circuit of claim 5, wherein the over-driving unit is an NMOS transistor which receives the over-drive control signal as a gate input and includes a drain and a source coupled to a terminal providing a power supply voltage and the terminal providing the core voltage, respectively.

7. The integrated circuit of claim 6, wherein the over-drive control signal has a higher voltage level than the power supply voltage during an enabled duration thereof.

8. The integrated circuit of claim 3, wherein the first reference voltage generation unit comprises:

a first dividing block configured to divide the first reference voltage at a first division rate to generate a first divided voltage;

a first comparison block configured to compare the first divided voltage with the source reference voltage to generate a first comparison signal; and a first driving block configured to drive a terminal providing the first reference voltage with the power supply voltage in response to the first comparison signal.

9. The integrated circuit of claim 3, wherein the second reference voltage generation unit comprises:

a second dividing block configured to divide the second reference voltage to generate a second divided voltage;

a second comparison block configured to compare the second divided voltage with the source reference voltage to generate a second comparison signal; and a second driving block configured to drive a terminal providing the second reference voltage with the power supply voltage in response to the second comparison signal.

10. The integrated circuit of claim 3, wherein the core voltage generation unit comprises:

a third dividing block configured to divide the core voltage to generate a third divided voltage;

a third comparison block configured to compare the third divided voltage with the first reference voltage to generate a third comparison signal; and a third driving block configured to drive a terminal providing the core voltage with a power supply voltage in response to the third comparison signal.

11. The integrated circuit of claim 3, wherein the bit line pre-charge voltage generation unit comprises:

a fourth comparison block configured to compare the second reference voltage with the bit-line pre-charge voltage to generate a fourth comparison signal;

a pull-up driving block configured to drive a terminal providing the bit-line pre-charge voltage with a power supply voltage in response to the comparison signal; and a pull-down driving block configured to drive the terminal providing the bit-line pre-charge voltage with an external ground voltage in response to the comparison signal.

12. An integrated circuit, comprising:

a reference voltage generation circuit configured to generate a first reference voltage corresponding to a core voltage and a second reference voltage corresponding to a cell plate voltage;

a core voltage generation unit configured to generate the core voltage based on the first reference voltage; and a cell plate voltage generation unit configured to generate the cell plate voltage based on the second reference voltage, wherein the reference voltage generation circuit comprises:

a source reference voltage generation unit configured to generate a source reference voltage by using a power supply voltage and a ground voltage;

a first reference voltage generation unit configured to generate the first reference voltage based on the source reference voltage; and a second reference voltage generation unit configured to generate the second reference voltage based on the source reference voltage.

13. The integrated circuit of claim 12, further comprising:

an over-driving unit configured to supply a power supply voltage to a terminal providing the core voltage in response to an over-drive control signal.

14. The integrated circuit of claim 12, wherein the first reference voltage generation unit comprises:

a first dividing block configured to divide the first reference voltage at a first division rate to generate a first divided voltage;

a first comparison block configured to compare the first divided voltage with the source reference voltage to generate a first comparison signal; and a first driving block configured to drive a terminal providing the first reference voltage with the power supply voltage in response to the first comparison signal.

15. The integrated circuit of claim 14, wherein the second reference voltage generation unit comprises:

a second dividing block configured to divide the second reference voltage at a second division rate to generate a second divided voltage;

a second comparison block configured to compare the second divided voltage with the source reference voltage to generate a second comparison signal; and a second driving block configured to drive a terminal providing the second reference voltage with the external power source voltage in response to the second comparison signal.

16. The integrated circuit of claim 12, wherein the core voltage generation unit comprises:

a dividing block configured to divide the core voltage to generate a divided voltage;

a first comparison block configured to compare the divided voltage with the first reference voltage to generate a first comparison signal; and a driving block configured to drive a terminal providing the core voltage with an external power source voltage in response to the first comparison signal.

17. The integrated circuit of claim 16, wherein the cell plate voltage generation unit comprises:

a second comparison block configured to compare the second reference voltage with the cell plate voltage to generate a second comparison signal;

a pull-up driving block configured to drive a terminal providing the cell plate voltage with an external power source voltage in response to the second comparison signal; and a pull-down driving block configured to drive the terminal providing the cell plate voltage with an external ground voltage in response to the second comparison signal.

* * * * *